United States Patent [19]
Gloton et al.

[11] Patent Number: 5,569,879
[45] Date of Patent: Oct. 29, 1996

[54] INTEGRATED CIRCUIT MICROMODULE OBTAINED BY THE CONTINUOUS ASSEMBLY OF PATTERNED STRIPS

[75] Inventors: Jean-Pierre Gloton, La Ciotat; Damien Laroche, Chateauneuf le Rouge; Joel Turin, Marseille; Michel Fallah, Carnoux, all of France

[73] Assignee: Gemplus Card International, Gemenos, France

[21] Appl. No.: 413,379

[22] Filed: Mar. 30, 1995

Related U.S. Application Data

[62] Division of Ser. No. 107,710, filed as PCT/FR92/00158, Feb. 19, 1991, Pat. No. 5,470,411.

[30] Foreign Application Priority Data

Feb. 19, 1991 [FR] France .................. 91 01934

[51] Int. Cl.$^6$ .................................. H01L 23/28
[52] U.S. Cl. ................. 174/52.2; 361/728; 257/678
[58] Field of Search .................. 174/52.1, 52.2, 174/52.3, 52.4; 257/678, 787, 788, 687, 700, 702, 729; 361/728; 29/841

[56] References Cited

U.S. PATENT DOCUMENTS

| | | | |
|---|---|---|---|
| 4,800,419 | 1/1989 | Long et al. | 357/70 |
| 5,008,734 | 4/1991 | Dutta et al. | 257/74 |
| 5,012,386 | 4/1991 | McShane et al. | 361/386 |
| 5,034,800 | 7/1991 | Marchisi | 357/72 |
| 5,051,275 | 9/1991 | Wong | 427/58 |
| 5,087,961 | 2/1992 | Long et al. | 357/69 |
| 5,115,298 | 5/1992 | Loh | 357/70 |
| 5,173,766 | 12/1992 | Long et al. | 257/687 |
| 5,175,397 | 12/1992 | Lindberg | 174/52.4 |
| 5,261,157 | 11/1993 | Chang | 29/844 |

*Primary Examiner*—Kristine L. Kincaid
*Assistant Examiner*—Robert J. Decker
*Attorney, Agent, or Firm*—Nilles & Nilles, S.C.

[57] ABSTRACT

A micromodule includes a slotted metal strip and a perforated dielectric strip having a thickness of less than 70 micrometers, preferably between 30 and 50 micrometers. The metal strip is bonded to the dielectric strip so as to overlie the slots in the metal strip. A chip is bonded to the dielectric strip and connected to the metal strip through the perforations in the dielectric strip. An insulating resin layer encapsulates the chip and is bonded to the dielectric strip. The micromodule may be used, for example, in a smart card, as a radiating antenna, or as an identification label.

20 Claims, 4 Drawing Sheets

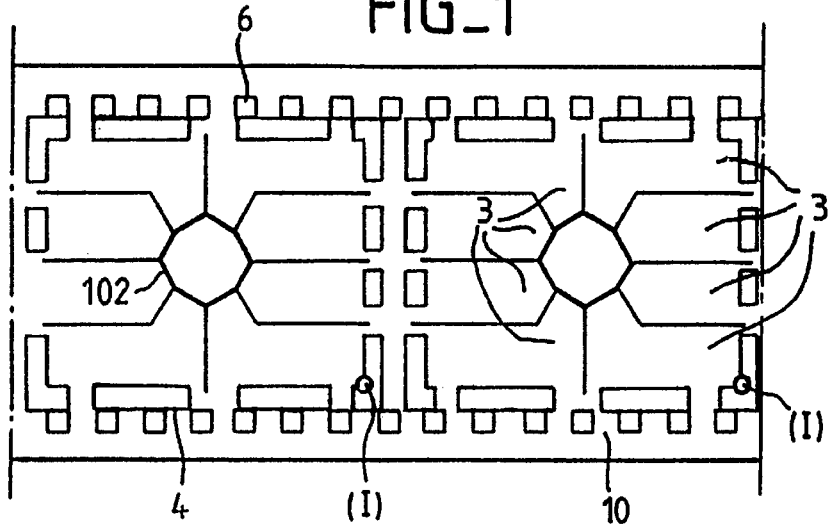
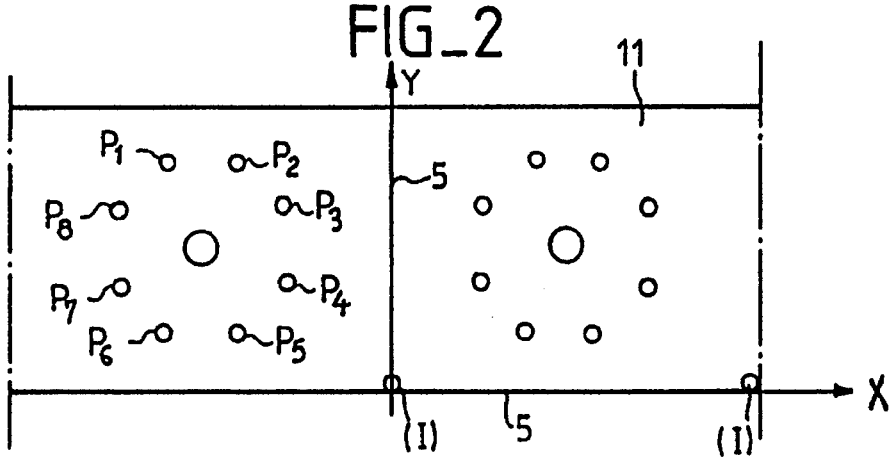
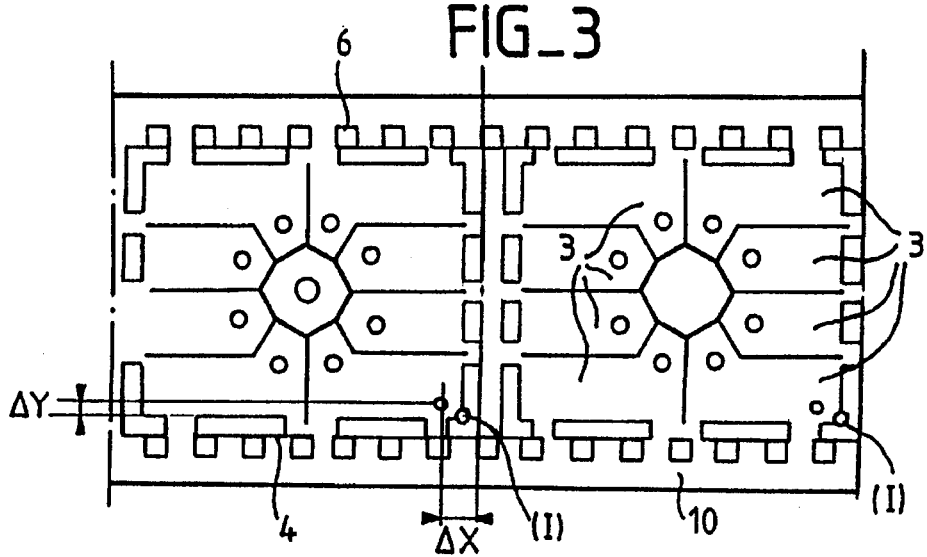

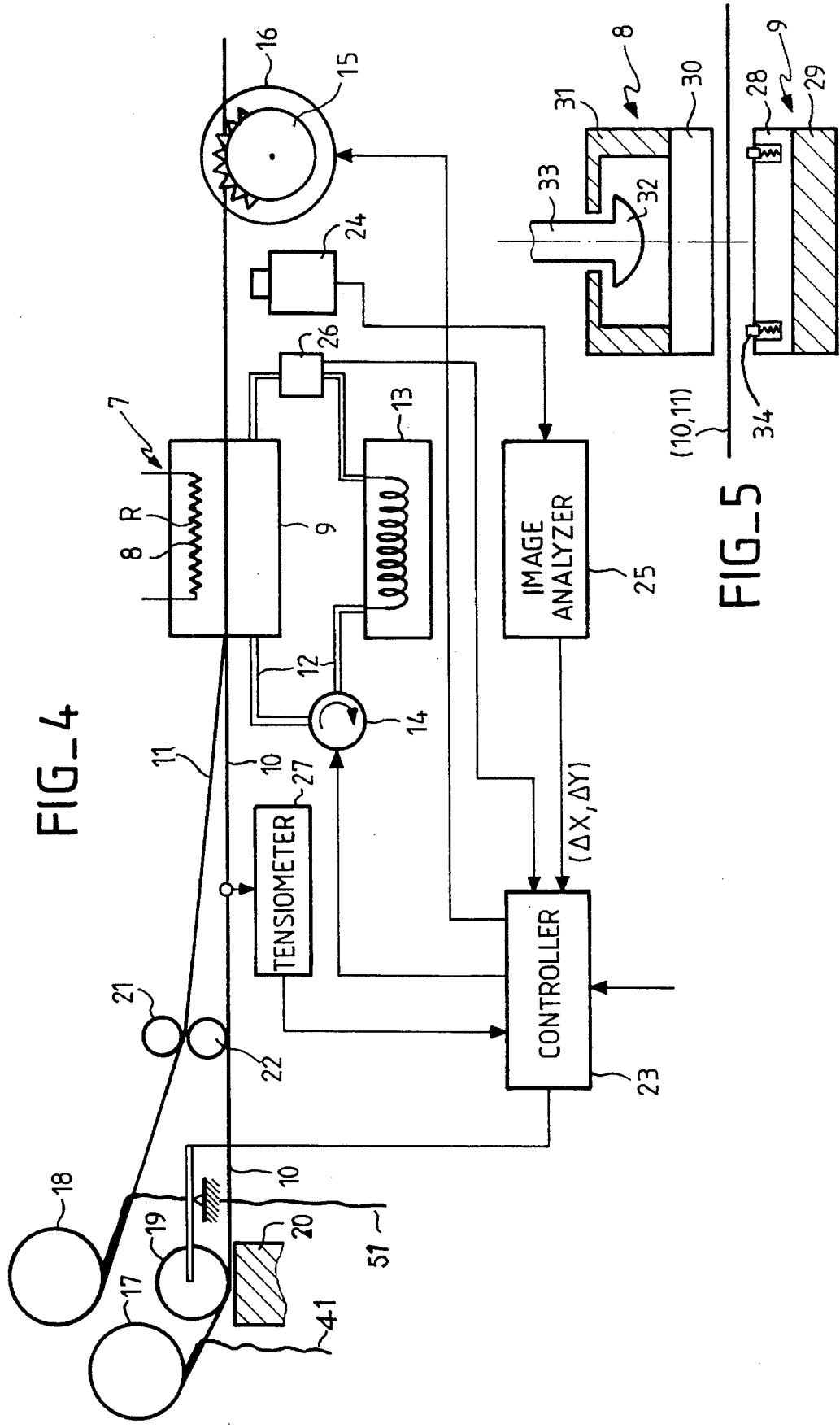

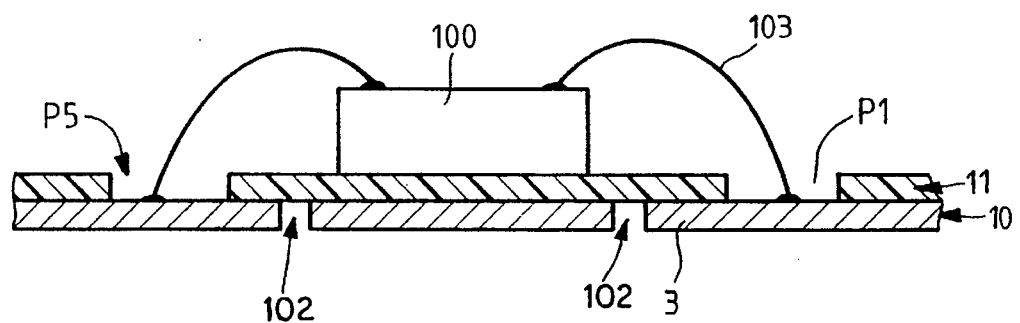
FIG_6
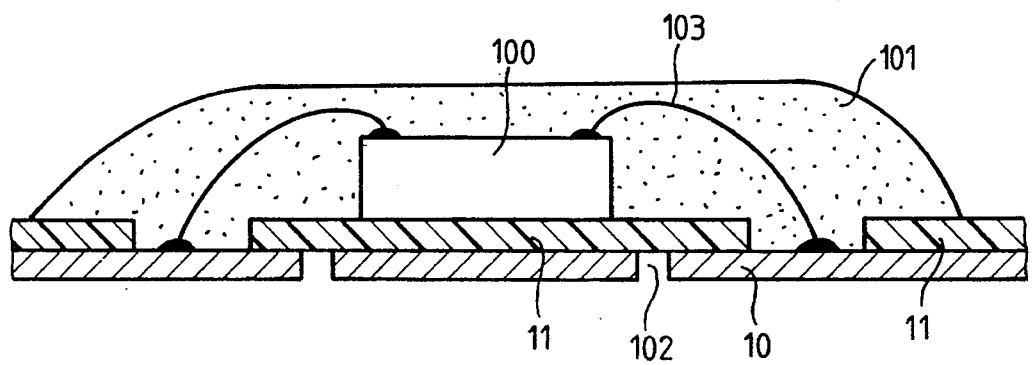
FIG_7
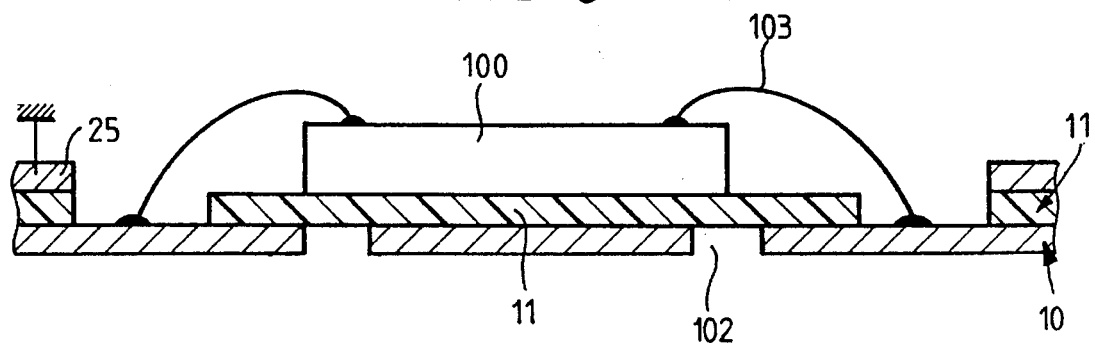
FIG_8

FIG_9
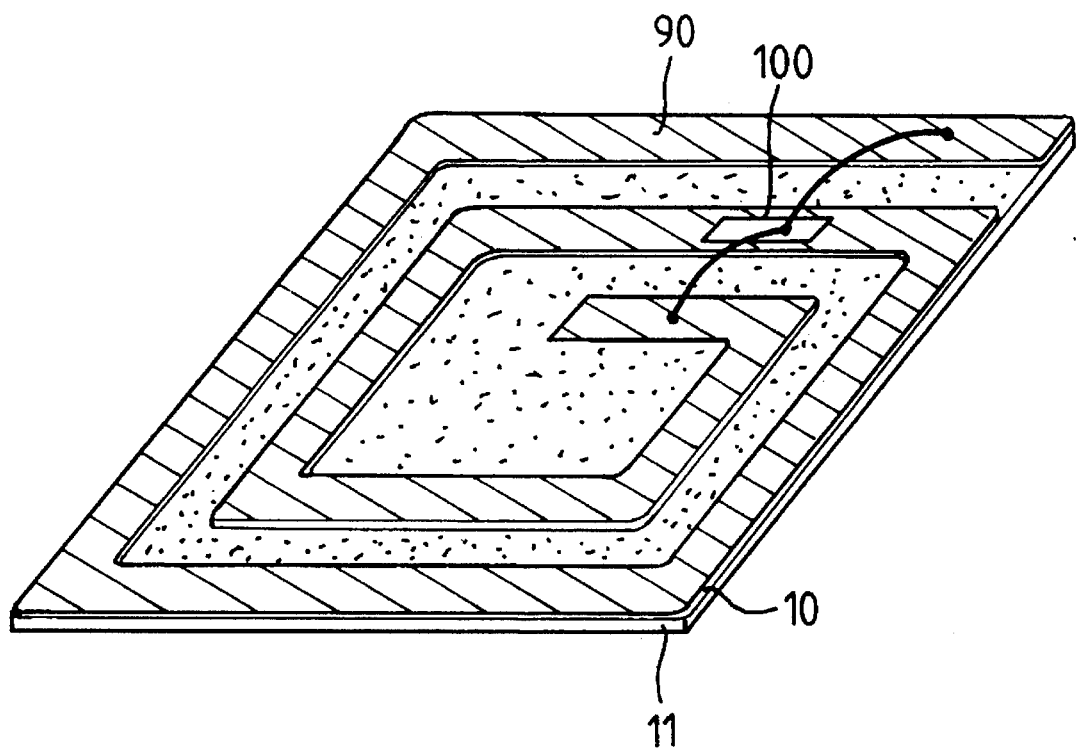

INTEGRATED CIRCUIT MICROMODULE OBTAINED BY THE CONTINUOUS ASSEMBLY OF PATTERNED STRIPS

REFERENCE TO AN APPLICATION

This application is a division of Ser. No. 08/107,710, filed as PCT/FR92/00158 Feb. 19, 1991, now U.S. Pat. No. 5,470,411.

BACKGROUND OF THE INVENTION

1. Field of the Invention

The present invention relates to an integrated circuit micromodule obtained by the continuous assembly of patterned strips. Such micromodules go into the production of the portable flat cards known as "chip cards." In these cards, the micromodules are formed by a set of elements comprising: a chip in integrated circuit form, metal contacts used for the connection of the micromodule with external devices, linking wires to link the chip to the metal contacts, and a protective coat formed by a resin covering the chip, the linking wires and, partially, the metal contacts.

2. Discussion of the Related Art

To manufacture a micromodule and then incorporate it into a card, a first known method consists in mounting the chip on a metal strip that has been pre-slotted in the form of a conductor grid, soldering the chip to a zone of this grid where it is connected by wires soldered to other zones of the grid, coating the chip and the wires with a drop of protective resin of the epoxy or silicone type in leaving the conductors of the grid partially bared, cutting up the metal strip into individual micromodules, each comprising a coated chip and bared external contacts, and then bonding the micromodule to a surface cavity of a card made of plastic material in such a way that grid portions not coated with resin are flush with the surface of the card and constitute the external connector of the card.

According to a second method which is also known, the initial pre-cut metal strip is replaced with a metallized dielectric strip etched with a connection pattern to be determined. The dielectric strip, in this case, forms the main support of the chip. The connections have a very small thickness and are obtained by the pre-deposition of a metal layer on the photo-etching plastic strip of this metal layer. The chip is connected by soldered wires to zones of the metallized layer.

These methods have a certain number of drawbacks. In the case of the use of a pre-cut metal strip, the encapsulation resin of the micromodule adheres poorly to the conductors of the grid, all the more so as, in practice, the resin is on only one side of the strip, the other side being reserved to leave the conductors accessible to act as connectors. The result thereof is a problem of reliability that is difficult to resolve, caused chiefly by the passage of moisture between the resin and conductors.

In the case of the use of a metallized and photo-etched dielectric strip, the strip must necessarily be made of a sufficiently rigid material, and must stand up well to temperature so as not to warp when the temperature rises, which makes it necessary for the definition of the conduction pattern to be executed only by photo-etching on the dielectric strip and makes this second method far costlier than a mechanical cutting-out operation, for example.

A third method is known through the European patent application published under No. 0 296 511 and filed under No. 88 1097420 on 18th Jun. 1988. This patent application relates to a method for the manufacture of a ribbon designed to provide modules to equip electronic cards, also called "smart cards." However, the approach proposed in this patent application is not satisfactory.

Indeed, this method entails taking a metal strip with a thickness that is typically equal to 75 micrometers but may vary between 50 micrometers and 150 micrometers. This strip is provided with (1) perforations enabling it to be carried along and (2) apertures obtained by stamping that demarcate the arrays of conductors of the circuits. A set of 125-micrometer-thick insulating foils having, on one face, a thermoplastic or thermosetting material for hot bonding, is also taken. The foils have a set of holes with an arrangement that corresponds to the location of the connections and a central hole for the location of the circuit.

The foils are bonded to the metal strip by heating. The heating prompts a certain shrinkage of the insulator material which makes it difficult to use bigger foils, especially in the longitudinal direction. With cold bonding, this problem would not arise. However, the adhesion to the metal during cold bonding is poor.

Furthermore, it is imperatively necessary to make a perforation in each insulator foil at the position reserved for the circuit in order to house the circuit therein and thus keep within the requisite tolerances as regards thickness for the manufacture of the chip cards.

Reference could also be made, as part of the prior art, to the document GB 2031796 A which describes a device for the assembling of an adhesive insulator strip to a conductive strip. In the device described, the adjusting of the tension is done only on the insulator strip by modifying the rotational speed of the wheels between which this strip passes. A device such as this does not enable the use of very thin (30 to 50 µm) insulator strips as is made possible by the invention.

OBJECTS AND SUMMARY OF THE INVENTION

The present invention makes it possible to overcome these problems. Its object is to provide an integrated circuit micromodule comprising a pre-slotted metal grid, a perforated dielectric strip with a thickness of less than 70 micrometers, a chip (1) bonded either to this dielectric strip or to the metal strip through a perforation of the dielectric strip and (2) connected to the metal strip through other perforations of the dielectric strip.

Another object of the present invention is to provide an integrated circuit module in which the dielectric strip covering the grid constitutes the dielectric of an electromagnetic transmission or reception antenna, the pre-slotted grid of which constitutes an active part.

The dielectric strip, may, for example, constitute the dielectric of an electromagnetic antenna, the pre-slotted metal strip of which constitutes an active part. Alternatively, the dielectric strip may constitute an identification label.

BRIEF DESCRIPTION OF THE DRAWINGS

Other characteristics and advantages of the present invention shall appear from the following description, made with reference to the appended drawings in which like reference characters represent like parts throughout and in which:

FIG. 1 is a top view of a pre-slotted metal strip usable in a micromodule constructed according to the invention;

FIG. 2 is a top view of a perforated dielectric strip usable in the micromodule and designed to be bonded to the metal strip of FIG. 1;

FIG. 3 is a view showing the juxtaposition of the two strips being bonded;

FIG. 4 shows a device for the implementation of a method of making a micromodule constructed according to the invention;

FIG. 5 represents a press used for the implementation of the micromodule production method;

FIG. 6 shows the micromodule according to the invention, at an intermediate stage of manufacture;

FIG. 7 shows the micromodule according to the invention, at a final stage of manufacture;

FIG. 8 represents a micromodule constituting a transmission/reception antenna; and FIG. 9 represents a micromodule constituting an identification label.

DETAILED DESCRIPTION OF THE PREFERRED EMBODIMENT

The pre-slotted metal strip 10 which is shown in FIG. 1 is formed by a strip of copper or tinned copper with a thickness of about 35 to 70 micrometers. Its width is defined to correspond to the final connection width to be obtained, and may be of the order of one centimeter to several centimeters. The strip 10 is slotted with a repetitive pattern of slots 102 which, as the case may be, is done by stamping to define the separate contacts 3 used as connection pins between the interior and the exterior of the micromodule to be assembled on the strip.

In the representation shown in FIG. 1, which is given by way of an example, the pattern of slots 102 is the one that enables the connection of a micromodule for flat chip cards, the contacts 3 shown being eight in number. The eight separate contacts 3 can be seen inside a closed line 4. These contacts are separated by cutting lines 5 that cut out the patterns 2. Outside the lines 4, the contacts 3 are joined to ensure the continuity of the strip 10 from one micromodule to another.

The strip 10 comprises regular perforations 6 distributed along the longitudinal edges of the strip on one or both of its sides. These perforations are used to carry the strip along by a toothed wheel system.

The slotted metal strip 10 forms the main support of the chips constituting the core of the micromodules. This strip 10 is covered with a dielectric strip 11 of the type shown in FIG. 2, comprising pre-cut perforations ($P_1$–$P_8$) designed to come before conductive zones 3 of the conductive pattern cut out of the metal strip 10. An indexing hole (I) serves as a reference mark and enables the precise positioning of the perforations ($P_1$–$P_8$) facing the conductive zones 3 during the operation for the hot bonding of the two strips to each other.

As indicated in FIG. 3, the indexing hole is located, when the bonding operation is terminated, at the intersection of the two bonding axes, respectively, the horizontal axis X and the vertical axis Y formed by the cutting lines 5. This positioning is done by the strip assembling device shown in FIG. 4

This device comprises a press 7 comprising two plates or, possibly, two juxtaposed rollers 8 and 9, between which there move patterned strips 10 and 11 that have to be assembled by bonding. In FIG. 4, the upper plate or roller 8 is heated up to a bonding temperature of about 200° C. by an electrical resistor R supplied by an external electrical current supply device (not shown). The lower plate 9 is cooled by a water circulation circuit 12 going through a heat pump type of temperature exchanger 13 or any other equivalent device activated by a pump 14. The strips 10 and 11, once bonded, are carried along in a translation motion between the two plates or rollers 8 and 9 by a sprocket wheel 15, the teeth of which engage in the perforations 6 of the support strip or cross-motion clamp system. The sprocket wheel 15 is moved by a motor 16. The strips 10 and 11 are paid out, respectively, from two loading rollers 17 and 18. Indeed, in order to obtain a continuous assembly of the strips 10 and 11, these strips are each mounted on an unwinder and moved by a motor (not shown).

The strip 10 is mounted on the roller 17 while the strip 11 is mounted on the roller 18. The strip 10 is wound on itself with an interposed strip 41 that falls away when the strip 10 unwinds. This interposed strip 41 prevents the patterns from getting imbricated with one another. The strip 11 is also wound on itself. An intercalary strip 51 may be planned too, to prevent problems during the unwinding of the strip 11.

The traction of the supporting strip 10 is adjusted by a pressure wheel 19 on a beam 20 of the supporting strip 10. The beam 20 then retains the strip 10 by friction and procures the tension of this strip. The tension of the strip to be bonded 11 is adjusted by two pinch rollers 21 and 22 with calibrated friction. A controller 23 provides, firstly, for the rotational control of the motor 16 and the pump 14 and, secondly, for that of the presser wheel 19. The controller 23 receives information elements coming, firstly, from a camera 24 by means of an image analyzer 25 and, secondly, a temperature sensor 26 connected to the fluid circulation circuit 12, as well as a device 27 formed by a tensiometer or any other equivalent device to measure the tension of the supporting strip 10. Thus, when the two strips 10 and 11 driven by the traction of the motor 16 move past under the rollers or between the two plates 8 and 9, the image analyzer 25 can permanently provide information on the offset Delta X and Delta Y of the reference hole or indexation hole with respect to the reference axes X and Y of each pattern. The value of this arrangement is that, through the controller 23, it enables action jointly or separately on the pressure exerted on the strip 10 or the strip 11, respectively, by (1) the presser wheel 19 in order to adjust the tension of the strip 10 or the strip 11 by the pinch rollers 21 and 22 and by (2) the adjusting of the temperatures of the two plates or pinch rollers 8 and 9 in order to adjust, by extension or expansion, the position of one strip with respect to the other one to obtain the coinciding of the pattern pitch of the two strips by cancelling the offsets Delta X and Delta Y of the reference hole with respect to the reference axes X and Y. It must be noted, however, that adjustment of the pitch by the simple extension of one of the two strips in relation to the other is valid only for the small offsets Delta X and/or Delta Y of the values of the pitch, and that big offsets can be efficiently compensated for only by an adjustment of the relative temperatures of the plates or rollers 8 and 9 with respect to each other. In practice, when an offset Delta X exceeds a predetermined threshold, the compensation for this offset is achieved by the controller 23 acting on the cooling of the plate 9. In the case of small offsets, the compensation is achieved by acting on the pinch rollers 19 or 21, 22. However, for the system to work efficiently, it is preferable to apply the strip that has the highest expansion coefficient to the plate or roller 9 which is cooled, the other strip 11 being applied to the plate or roller 8 that is heated. Thus, for example, for a bonding of a copper roll which has an expansion coefficient of $17 \times 10^{-6}/°C$. on a roll of a plastic material, commercially available under the registered mark "Kapton", which has an expansion coefficient of $20 \times 10^{-6}/°C$., the Kapton should be applied to the plate or roller 9 and the copper to the plate or pinch roller 8.

During the bonding operation, it should naturally be seen to it, when the plates/rollers 8 and 9 come under pressure, that these elements 8 and 9 move properly solely in the direction Z normal to the plane (X, Y) of the two strips. The problem can be resolved easily by using either column presses or presses with distribution springs. However, to avoid having the positions, between the axes, that evolve with the temperatures, it is desirable, in the case of the column presses, to use steels with a low expansion coefficient by using, for example, steel that is commercially distributed under the known registered mark "Invar" for example.

The approach using a rod-type press, a diagram of the embodiment of which is shown in FIG. 5, has the advantage of being easy to make and of providing homogeneous pressure between the two plates. As can be seen in FIG. 5, where the elements homologous to those of FIG. 4 are shown with the same references, a press comprises a lower plate 9 formed by a steel board 28 mounted on an insulating board 29 and an upper plate 8 formed by a steel board 30 comprising a hollow insulating cap 31 enclosing the head 32 of a rod 33. The steel board 28, on its surface facing the steel board 30, has distribution springs 34 which enable the rod head 32, the steel board 30 and the spring 34 to be all in contact together before the pressure of the two boards 28 and 30 is exerted on the two strips 10 and 11, thus preventing any motion in the directions X and Y during the clamping of the two plates.

Once the bonding is done, it can be further homogenized, possibly by a second press (not shown), which then has the same temperatures on both plates, or by two rollers similar to those already used in the prior art.

Naturally, the method that has just been described can equally well be applied with the same efficiency for the indexed assembly of any material with identical or multiple pitch patterns. The method can also be applied to the bonding of any number N of strips by the interposing of N pre-bonding presses before the homogenization station. The usefulness then is that it enables the continuous production of multilayer films.

Thus, the method according to the invention enables the manufacture of integrated circuit micromodules, this manufacture comprising the formation of a preslotted metal strip comprising notably regular perforations enabling the strip to be carried along by a toothed wheel (as with the forward feed of a cinema film), the formation of a very thin perforated dielectric strip; and then bonding the two strips to each other, the bonding of an integrated circuit chip to the thin dielectric strip, and the formation of electrical connections between the chip and the metal strip through the slots of the dielectric strip. In principle, the dielectric strip will be narrower than the metal strip: it will include no periodic lateral slots enabling it to be carried along by a toothed wheel and, furthermore, it will generally be too thin to be carried along by a toothed wheel. During the bonding of the dielectric strip to the metal strip, the slots enabling the metal strip to be carried along will not be covered by the dielectric strip owing to the smaller width of this strip.

The other manufacturing operations may be standard ones, for example: the deposition of a drop of resin to coat the chip and the connections with the chip, on the dielectric strip side but not on the metal strip side, and possibly the leveling down of the drop to a determined height; the separation of the micromodule from the rest of the strip. The micromodule is then ready to be inserted into a cavity of a plastic card.

It is furthermore observed that, by this method, it is no longer the dielectric strip that is used to carry the unit along during the assembly line manufacture of micromodules out of a continuous strip, as might have been the case in the prior art technique when a dielectric strip was provided for. The thickness of the dielectric strip 11 is far smaller than in the prior art, 30 to 50 micrometers instead of 100 to 200 micrometers, for example. This is very important, for the total thickness of the micromodule is a decisive factor for the possibility of making very flat chip cards.

Furthermore, in view of this very small thickness, the chip may be bonded to either the dielectric strip 11 or to the metal strip 10. Cases where it is not necessary to provide for a rear face contact are indeed frequent in CMOS technology. When mechanical stresses are exerted on the card, the thin dielectric placed beneath the card plays the role of an elastic buffer which, in certain cases, prevents the chip from deterioration.

During manufacture, the small thickness of the dielectric strip 11 facilitates a very efficient bonding of the two strips to each other, without any risk of their getting separated during the subsequent treatment.

Finally, the bonding of the chip to the dielectric makes it possible to provide for only one micromodule manufacturing line, whatever the dimension of the chip to be encapsulated, this being achieved with a single model of pre-slotted metal strip, the sole condition being that there should be provided a modifiable or detachable punching tool for the formation of the slots in the electrical strip; indeed, the chip is insulated from the metal grid, and only the location of the perforations in the dielectric defines the position of the connections between the chip and the grid. For a larger-sized chip, the perforations will be placed at a greater distance from the center of the chip. For a smaller chip, the perforations will be brought closer to the center. It is naturally sufficient for the perforations to remain above the appropriate metal zones, but these zones may be fairly wide in the case of micromodules with a small number of external contacts (6 or 8 for example).

Referring to FIGS. 6 and 7, a micromodule is illustrated which is constructed in accordance with a preferred embodiment of the invention and which may be constructed via the process described above. In FIG. 6, the micromodule is illustrated in an intermediate stage of manufacture in which it comprises a slotted metal grid or strip 10 bonded to a very thin perforated dielectric strip 11 (the thickness of the dielectric strip 11 preferably being smaller than 50 micrometers, more generally between 30 and 70 micrometers), with a chip 100 bonded either to the metal strip 10 or to the dielectric strip 11 and connected to the metal strip 10 through the perforations P1, P5 of the dielectric strip 11 via conductors 103.

The chip 100 is then coated with a protective insulator 101, preferably an epoxy resin or a silicone resin that can be deposited in drops above the chip 100 (FIG. 7).

It will be noted that, contrary to what happens in the technique using a slotted metal strip without a dielectric, the resin 101 cannot flow between the conductors 103; i.e., in the slots 102 of the metal strip 10 since, in principle, all of these slots 102 are covered with the dielectric strip 11, at least in the part that will constitute the micromodule after the slotting of the strip 10.

The mechanical stresses on the chip 100 are particularly low during and after manufacture owing to the interposition, between the metal strip 10 and the chip 100, of a small thickness of polyamide or another dielectric strip 11 which behaves like a buffer of plastic or another insulating material. This is important when the micromodule is incorporated into a flat chip card for these cards are subject to very substantial twisting and bending stresses.

Given that it is possible to be satisfied with a very small thickness of dielectric, the height of the micromodule remains limited to an acceptable value despite the fact that the chip lies on the dielectric. By way of an indication, the chip 100 may have a thickness of about 250 micrometers and the strips 10 and 11 a thickness of less than 70 micrometers, typically about 50 micrometers each.

The encapsulation resin 101 adheres to a dielectric surface, which is better than if it were to adhere to a metal surface. There is no risk of any penetration of moisture up to the chip which is surrounded with resin wherever it does not touch the dielectric strip.

When the micromodule is finished (FIG. 7) after the leveling down of the resin 101 to a maximum desired height, it may, if necessary, be separated from the rest of the strip by being cut out mechanically along the line 4 of FIGS. 1 and 2. If it is a micromodule for chip cards whose connector is constituted by the accessible face of the conductors 103, the micromodule is placed in a cavity of the chip card, the face that bears the chip being pointed towards the bottom of the cavity and the conductors remaining accessible at the upper part.

In one variation of the invention (cf. FIG. 8), which is especially promising in the case of chip cards working in microwave applications and designed to receive and/or send an electromagnetic radiation, it is possible to provide for an arrangement where the dielectric strip 11 constitutes the dielectric of a radiating or electromagnetic antenna, of which the slotted metal strip or grid 10 constitutes an active part. The antenna is of the microstrip type constituted, for example, by conductors cut out in the metal strip 10 and acting as antennas instead of as connectors. An electrical ground plane 25 can then be provided for on the other side of the dielectric. This ground plane 25 can be formed either by means of a second metal strip 10 mechanically cut out and bonded to the upper face of the dielectric strip 11 before the positioning of the chips 100 or by means of a photo-etched metallization on the upper face of the dielectric strip 11. Conversely, it can be provided for the ground plane to be beneath (formed in the metal strip 10) and the microstrip antenna above (formed in the metallization of a metallized dielectric strip 11, or formed in a second metal strip bonded to the side of the chip).

According to one alternative embodiment, the micromodule may constitute an identification label. To this end, the grid 10 forms an inductor. The chip 100 can be placed in a metal zone and can be connected to both ends of the inductor 90. Advantageously, a low-cost dielectric will be used, for example, cardboard. A micromodule such as this is shown in FIG. 9 and constitutes a low-cost identification label.

What is claimed is:

1. A micromodule comprising a slotted metal strip bonded to a perforated dielectric strip having a thickness of less than 70 micrometers, and a chip bonded to one of the dielectric strip and the metal strip and connected to the metal strip through the perforations of the dielectric strip.

2. Micromodule according to claim 1, wherein the dielectric strip constitutes the dielectric of an electromagnetic antenna and the metal strip of which constitutes an active part of the antenna.

3. Micromodule according to claim 1, wherein the metal strip constitutes an inductor and the chip is connected to the ends of the inductor.

4. Micromodule according to claim 1, wherein the dielectric strip is made of a plastic material having an expansion coefficient of $20 \times 10^{-6}/°C$.

5. Micromodule according to claim 1, wherein the dielectric strip is made of cardboard.

6. Micromodule according to claim 3, wherein said micromodule constitutes an identification label.

7. A micromodule comprising:

(A) a perforated dielectric strip having a thickness of less than 70 micrometers;

(B) a slotted metal strip bonded to said dielectric strip; and (C) a chip bonded to one of said dielectric strip and said metal strip and connected to said metal strip through the perforations of said dielectric strip.

8. A micromodule as defined in claim 7, wherein said metal strip comprises an inductor and said chip is connected to opposed ends of said inductor.

9. A micromodule as defined in claim 8, wherein said micromodule forms a radiating antenna, wherein said dielectric strip defines a dielectric portion of said antenna, and wherein said metal strip defines an active portion of said antenna.

10. A micromodule as defined in claim 9, further comprising a ground plane provided on a side of said dielectric portion opposite said active portion.

11. A micromodule as defined in claim 10, wherein said ground plane comprises a second slotted metal strip bonded to said dielectric portion.

12. A micromodule as defined in claim 7, wherein said micromodule forms an identification label.

13. A micromodule as defined in claim 7, wherein said dielectric strip is made of a plastic material having an expansion coefficient of $20 \times 10^{-6}/°C$.

14. A micromodule as defined in claim 7, wherein said dielectric strip is made of cardboard.

15. A micromodule as defined in claim 7, wherein said dielectric strip has a thickness of between 30 and 50 micrometers.

16. A micromodule as defined in claim 7, further comprising a layer of an insulating resin encapsulating said chip and bonded to said dielectric strip.

17. A micromodule as defined in claim 16, wherein said chip is bonded onto said dielectric strip and said dielectric strip overlies the slots in said metal strip and seals the slots in said metal strip from said insulating resin.

18. A micromodule comprising:

(A) a slotted metal strip;

(B) a perforated dielectric strip having a thickness of between 30 and 50 micrometers and being bonded to said metal strip so as to overly the slots in said metal strip;

(C) a chip bonded to said dielectric strip and connected to said metal strip through the perforations of said dielectric strip; and (D) an insulating resin layer encapsulating said chip and bonded to said dielectric strip.

19. Micromodule according to claim 1, wherein said chip is bonded to said dielectric strip.

20. Micromodule according to claim 1, wherein said dielectric strip has a thickness of between 30 micrometers and 50 micrometers.

* * * * *